(12) United States Patent
Seo et al.

(10) Patent No.: US 9,389,264 B2
(45) Date of Patent: Jul. 12, 2016

(54) APPARATUS AND METHOD FOR PREVENTING ERRONEOUS DETECTION OF JACK

(71) Applicant: Samsung Electronics Co., Ltd., Gyeonggi-do (KR)

(72) Inventors: Ho-Soo Seo, Gyeonggi-do (KR); Mu-Sul Kim, Busan (KR); Jung-Hyeong Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 560 days.

(21) Appl. No.: 13/887,134

(22) Filed: May 3, 2013

(65) Prior Publication Data

US 2013/0293240 A1 Nov. 7, 2013

(30) Foreign Application Priority Data

May 3, 2012 (KR) .................. 10-2012-0046972

(51) Int. Cl.

| | |
|---|---|
| *G01R 31/00* | (2006.01) |
| *G01R 31/04* | (2006.01) |
| *H01R 13/641* | (2006.01) |
| *H04M 1/60* | (2006.01) |
| *H01R 24/58* | (2011.01) |
| *H04R 1/10* | (2006.01) |

(52) U.S. Cl.
CPC ............ *G01R 31/041* (2013.01); *H01R 13/641* (2013.01); *H01R 24/58* (2013.01); *H04M 1/6058* (2013.01); *H04R 1/1033* (2013.01); *H04R 2420/09* (2013.01)

(58) Field of Classification Search
CPC .. H01R 24/58; H01R 2107/00; H01R 13/641; H01R 13/6683; H01R 13/7031; H01R 13/64; H04R 1/1066; G01R 31/041; G01R 31/024
USPC ........... 381/384; 439/188, 344, 638, 668, 669
See application file for complete search history.

(56) References Cited

U.S. PATENT DOCUMENTS

| | | | |
|---|---|---|---|
| 2008/0305676 A1* | 12/2008 | Fiennes .............. | H01R 13/7031 439/489 |
| 2010/0166237 A1 | 7/2010 | Leeper | |
| 2011/0085673 A1* | 4/2011 | Lee ........................ | H01R 24/58 381/74 |
| 2011/0170734 A1 | 7/2011 | Lim | |

* cited by examiner

*Primary Examiner* — Daniel Miller

(57) ABSTRACT

An apparatus and method for preventing erroneous detection of a jack is provided. The apparatus includes a detection terminal configured to detect whether a jack plug of an earphone is inserted into the jack, a comparator configured to compare a voltage input from the detection terminal with a predetermined reference voltage and provide a comparison result signal to a baseband module, a resistor with a certain resistance value, being interposed between the detection terminal and the comparator to keep a voltage of a high signal not to be lowered than the predetermined reference voltage when the jack is conducted due to conductive particles flowed into the jack.

18 Claims, 4 Drawing Sheets

APPARATUS AND METHOD FOR PREVENTING ERRONEOUS DETECTION OF JACK

CROSS-REFERENCE TO RELATED APPLICATION(S) AND CLAIM OF PRIORITY

The present application is related to and claims the benefit under 35 U.S.C. §119(a) of a Korean patent application filed on May 3, 2012 in the Korean Intellectual Property Office assigned Serial No. 10-2012-0046972, the entire disclosure of which is hereby incorporated by reference.

TECHNICAL FIELD

The present disclosure relates to an apparatus and a method for preventing erroneous detection of a jack.

BACKGROUND

Recently, as multimedia technologies have been developed, electronic devices with various functions have been introduced, specifically portable terminals such as smart phones. It is common practice that these electronic devices have converged functions for complexly performing one or more functions.

Each of the portable terminals such as the smart phones which have been newly released to the market are capable of receiving terrestrial broadcasting, reproducing music files, photographs, or displaying moving pictures with high quality in addition to a general phone call function.

In order to perform the various additional functions, a user uses an earphone device (in general, is referred to as an earphone) with a jack plug which is inserted into a jack hole of a jack installed in an electronic device. In this earphone device, a jack plug is located at one end of a cable with a pair of ear speakers for generating sound in stereo at the other end. Also, it is common practice that a user utilizes a hands-free function during a call connection using a microphone which is installed in the cable.

The jack plug described above usually has a 3-pole or a 4-pole terminal. The 3-pole or 4-pole terminal is installed in electrically insulation. When the jack plug is inserted into the jack of the electronic device, both corresponding pins of the jack and the jack plug come in contact with and perform functions depending on a 3-pole or a 4-pole terminal.

For example, in case of a 3.5 phi 3-pole terminal, a first terminal located at the bottom of the jack plug is responsible for a SPK_L terminal, a second terminal located next to the first terminal is responsible for a SPK_R terminal, and a third terminal located next to the second terminal is responsible for a GND terminal. Each of the first to third terminals connects to respective corresponding pins of the jack electrically and performs its responsible function.

Also, in case of the 4 pole terminal, a first terminal located at the bottom of the jack plug is responsible as an SPK_L terminal, a second terminal located next to the first terminal is responsible as an SPK_R terminal, a third terminal located next to the second terminal is responsible as a GND terminal, and a fourth terminal located next to the third terminal is responsible as an MIC terminal. Each of the first to fourth terminals electrically connects to respective corresponding pins of the jack and performs its responsible function.

As described above, an jack for receiving an jack plug has a housing structure in which a plurality of pins are installed to contact corresponding pins of a jack plug. Particularly in recent years, an electric device detects an earphone by contacting the SPK_L terminal located at the bottom side of a jack plug of the earphone.

However, if conductive material such as a saline solution and water flows into a jack hole, an electronic device is short-circuited with resistance of these conductive particles. Accordingly, an electronic device recognizes as if a jack plug is inserted into a jack, and performs an erroneous operation. As a result, there is a need in the art for a reliable electronic device.

SUMMARY

To address the above-discussed deficiencies of the prior art, it is a primary object to provide an apparatus and method for preventing error recognition of a jack.

Another aspect of the present disclosure is to provide an apparatus and a method for preventing erroneous detection of a jack when conductive particles are flowed into a jack, or a jack is inundated.

Another aspect of the present disclosure is to provide an electronic device for solving an erroneous detection problem in which the electronic device recognizes as if a jack plug of an earphone is inserted into a jack upon conductive particles being inserted into a jack.

In accordance with an aspect of the present disclosure, an apparatus for preventing erroneous detection of a jack in an electronic device is provided. The apparatus includes a detection terminal configured to detect whether a jack plug of an earphone is inserted into the jack and a comparator configured to compare voltage input from the detection terminal with a predetermined reference voltage and provide a corresponding comparison result signal to a baseband module, wherein a resistor having a certain resistance value is interposed between the detection terminal and the comparator to keep a voltage of the high signal not to be lowered than the predetermined reference voltage although the jack is conducted by conductive particles inserted into the jack.

In accordance with another aspect of the present disclosure, a method of preventing erroneous detection of a jack in an electronic device is provided. The method includes comparing a voltage input from a detection terminal with a predetermined reference voltage of a comparator and providing a corresponding comparison result signal to a baseband module, wherein a resistor with a certain resistance value is interposed between the detection terminal and the comparator to keep a voltage of the high signal not to be lowered than the predetermined reference voltage although jack is conducted due to conductive particles flowed into the jack.

In accordance with another aspect of the present disclosure, an electronic device having a jack for receiving a jack plug of an earphone is provided. The electronic device includes a detection terminal configured to sense whether the jack plug is inserted into the jack and a comparator configured to compare a voltage input from the detection terminal with a predetermined reference voltage and provide a corresponding comparison result signal to a baseband module, wherein a resistor having a certain resistance value is interposed between the detection terminal and the comparator to keep a high signal not to be lowered than the predetermined reference voltage although the jack is conducted due to conductive particles flowed into the jack.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device. Exemplary embodiments of the present disclosure will be described herein below with reference to the accompanying drawings. In the following description, well-known functions or constructions are not described in detail since they would obscure the disclosure in unnecessary detail.

Hereinafter, a description will be given for an electronic device equipped with a jack to receive a jack plug. The electronic device can include any suitable devices which are equipped with a jack, such as a Personal Digital Assistant (PDA), a laptop computer, a smart phone, a netbook, a Mobile Internet Device (MID), a Ultra Mobile Personal Computer (UMPC), a tablet PC, a navigation device, or a Moving Picture Experts Group (MPEG) layer 3 (MP3) player.

Figure 1:
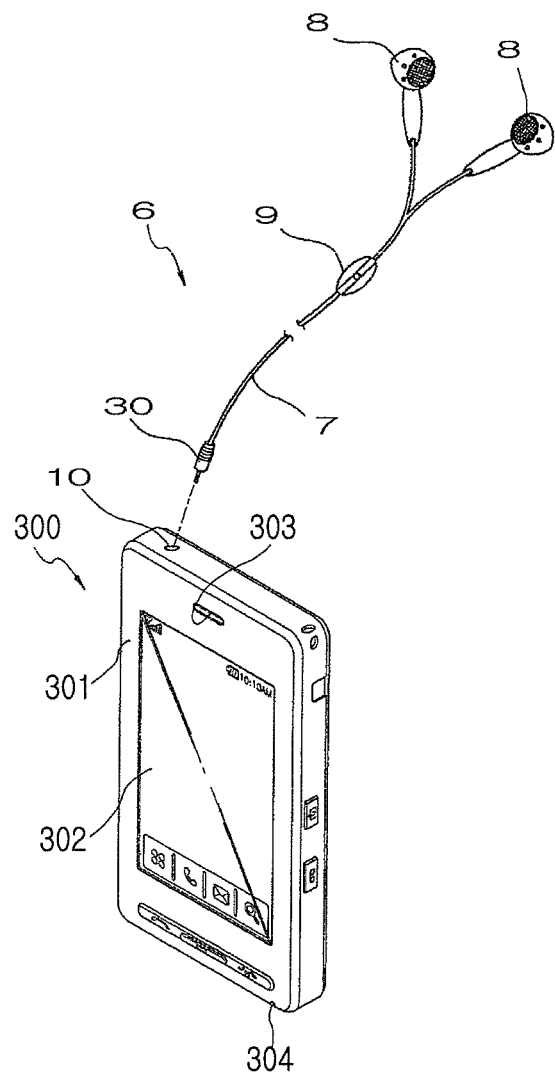
FIG. 1 illustrates an electronic device for preventing erroneous detection of a jack according to one exemplary embodiment of the present disclosure.

FIG. 1 illustrates an electronic device for preventing erroneous detection of a jack plug according to one exemplary embodiment of the present disclosure.

Referring to FIG. 1, the electronic device 300 includes a display unit 302, an ear piece 303, a microphone device 304, and a jack 10. The display unit 302 is disposed on a front surface 301 of the electronic device 300. The ear piece 303 is installed above the display unit 302. The microphone device 304 is installed at a lower side of the display unit 302. Also, the jack 10 into which a jack plug 30 of an earphone 6 is inserted is installed in a certain place of the electronic device 300.

The earphone 6 includes a pair of ear speakers 8 and a microphone device 9. The pair of ear speakers 8 is installed in a cable 7 of a certain length. The microphone device 9 including an operation button (e.g., a SEND/END key) can be further installed in a middle of the cable 7.

If the jack plug 30 of the earphone 6 is inserted into the jack 10, the electronic device 300 can detect that the earphone 6 is connected automatically and can perform a function corresponding to the connection of the earphone 6. For example, if the connection of the earphone 6 is detected, the electronic device 300 closes the other audio paths and outputs sound to the ear speakers 8 of the earphone 6.

In accordance with one exemplary embodiment of the present disclosure, although conductive particles are flowed into the jack 10, the electronic device 300 does not erroneously recognize that the jack plug 30 of the earphone 6 is inserted into the jack 10. Therefore, reliability of the electronic device 300 is secured.

Figure 2:
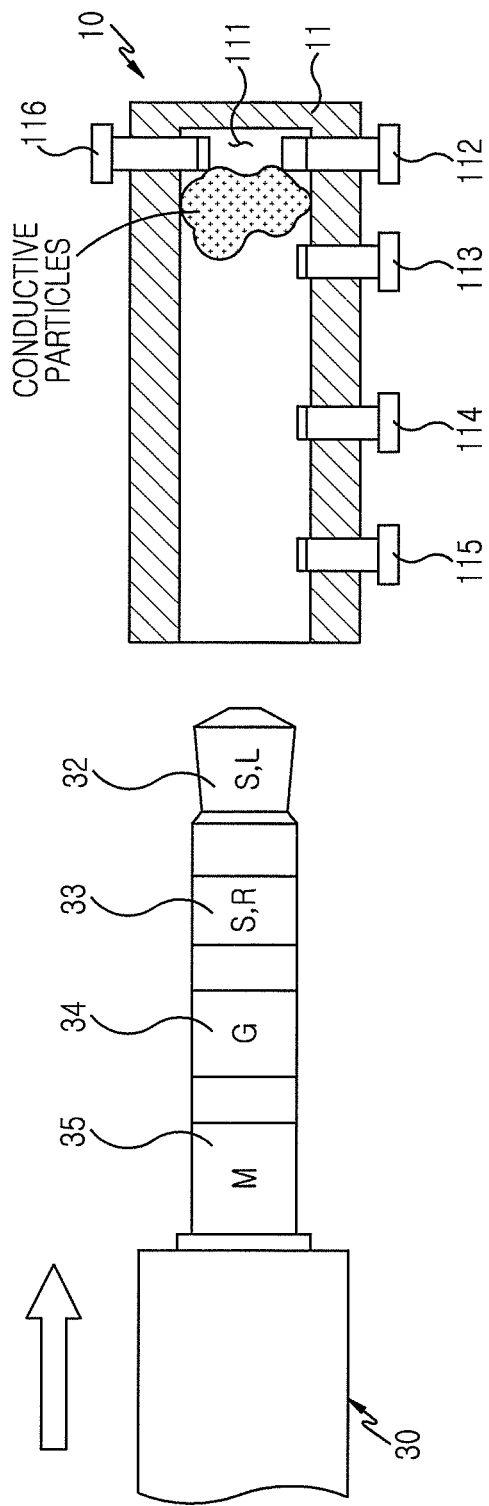
FIG. 2 illustrates a jack plug, and an intersection view of a jack into which conductive particles inserted according to one exemplary embodiment of the present disclosure.

FIG. 2 illustrates a jack plug of an earphone and an intersection view of a jack of an electronic device, where conductive particles are flowed into the jack, according to one exemplary embodiment of the present disclosure.

Referring to FIGS. 1 and 2, a first terminal located at the bottom of the jack plug 30 is responsible for an SPK_L terminal 32, a second terminal located next to the first terminal is responsible for an SPK_R terminal 33, a third terminal located next to the second terminal is responsible for a GND terminal 34, and a fourth terminal located next to the third terminal is responsible for an MIC terminal 35. The first to fourth terminals are disposed to correspond to respective an SPK_L pin 112, an SPK_R pin 113, a GND pin 114 and an MIC pin 115, which are sequentially protruded and installed in an inner space 111 of a housing 11 forming the jack 10.

Accordingly, if the jack plug 30 is entirely inserted into the inner space 111 of the housing 11, the SPK_L terminal 32, the SPK_R terminal 33, the GND terminal 34, and the MIC terminal 35 of the jack plug 30 contact the SPK_L pin 112, the SPK_R pin 113, the GND pin 114 and the MIC pin 115 of the jack 10, respectively. At this time, because the SPK_L terminal 32 also comes in contact with a detect pin 116 installed in the housing 11 of the jack 10, the electronic device 300 detects whether the earphone 6 is inserted into the jack 10.

However, as shown in FIG. 2, because not the jack plug 30 but conductive particles flow into the housing 11 of the jack 10 and come in contact with the detect pin 116, the jack 10 might be conducted. These conductive materials can be classified roughly into, for example, saline solution, water, and the like. These conductive particles can flow into the jack 10 by carelessness of a user or due to inundation. At a conservative estimate, theses conductive particles can have resistance values of a dozen of kilo-ohms to several mega-ohms. The jack 10 has an input value which is lower than a reference voltage according to these resistance values. For this reason, the electronic device recognizes that the jack plug 30 of the earphone 6 is inserted into the jack 10 and performs an erroneous operation.

However, in accordance with one embodiment of the present disclosure, although conductive particles flow into the jack 10 and the jack 10 is conducted, an input signal received from the earphone 6 is not changed from a high level to a low level by a lowered reference voltage by interposing a resistor having a certain resistance value between a detect end and a comparator of the jack 10. That is, a detect operation is not performed by conductive particles except for normal insertion of the jack plug 30.

Figure 3:
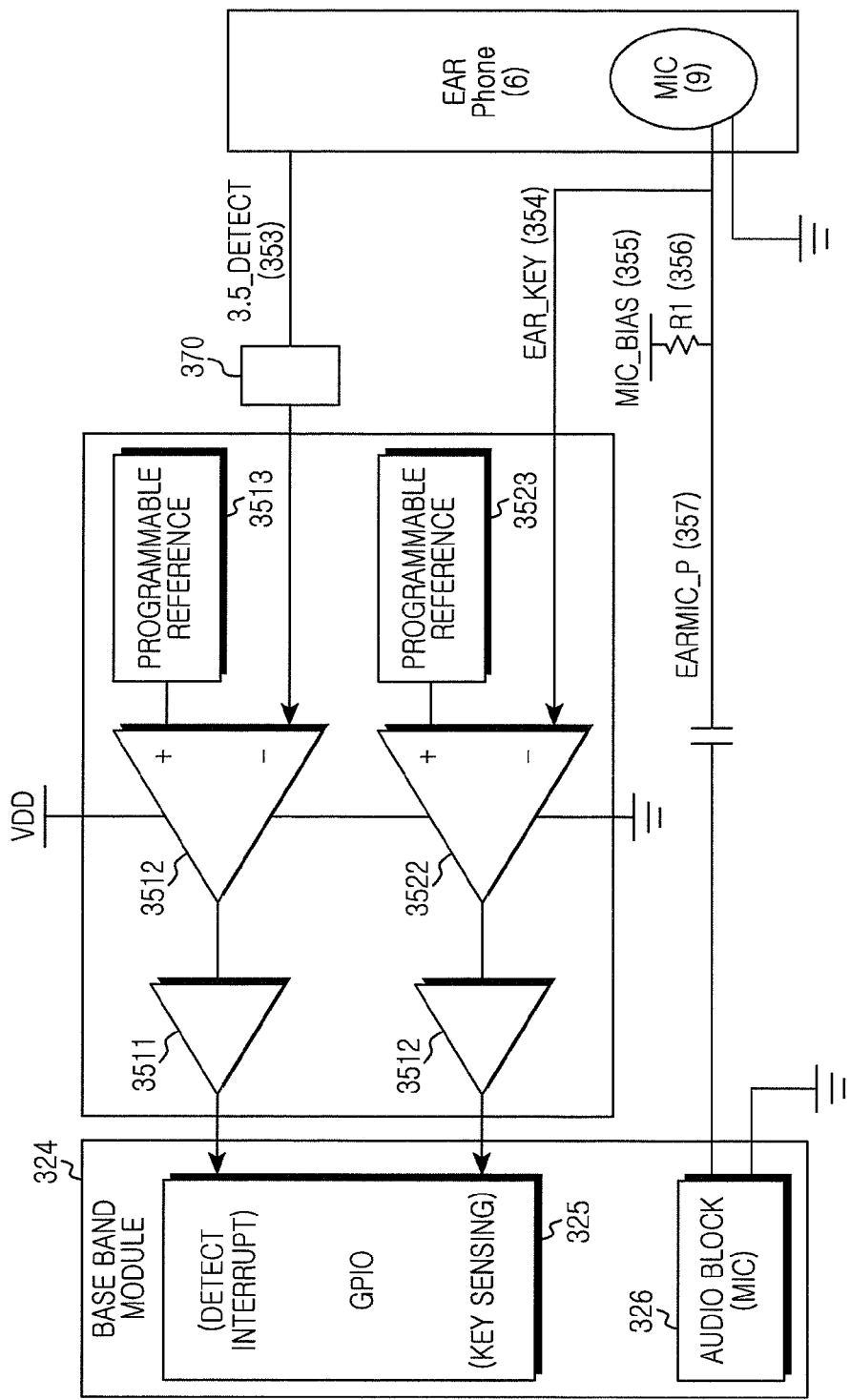
FIG. 3 is a block diagram illustrating an apparatus for preventing, erroneous detection of a jack according to one exemplary embodiment of the present disclosure.
Figure 4:
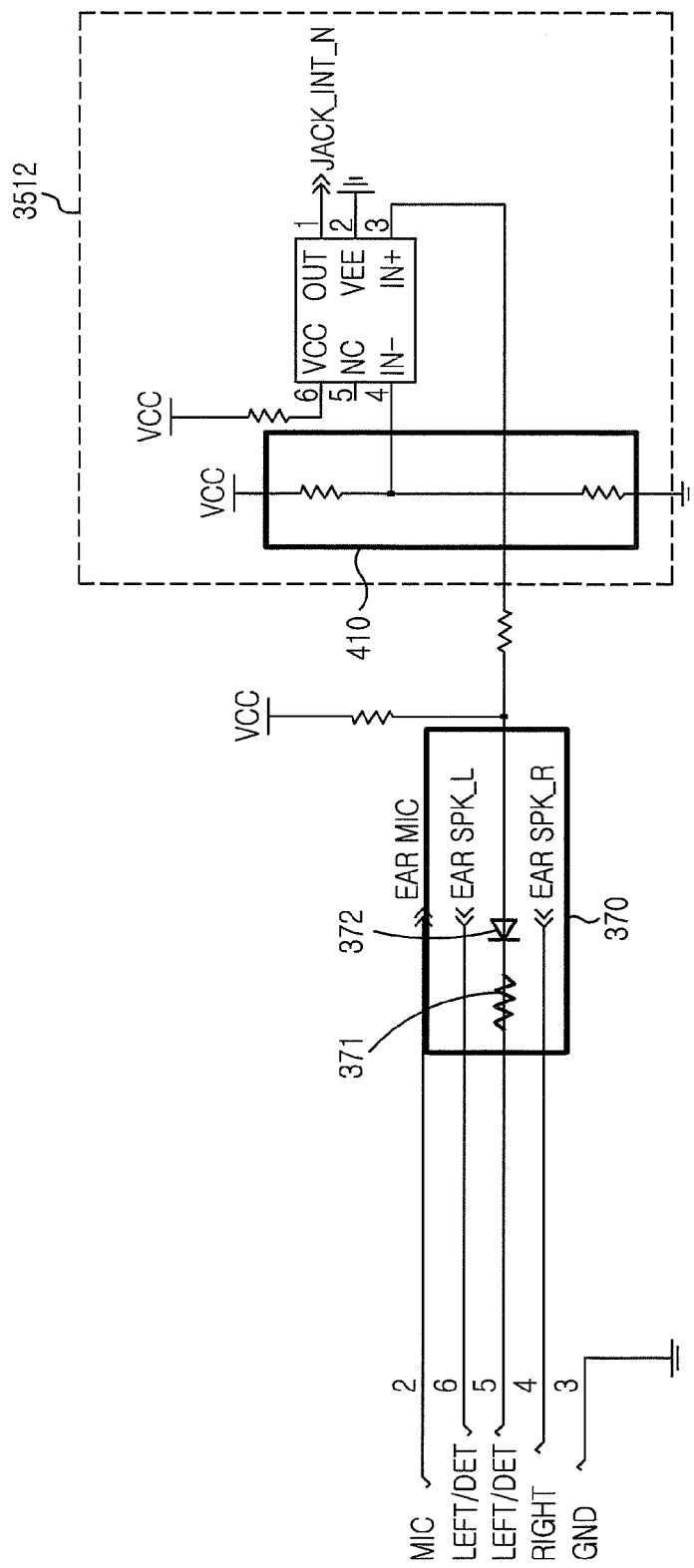
FIG. 4 is a circuit diagram for preventing erroneous detection in an electronic device according to one exemplary embodiment of the present disclosure.

FIG. 3 is a block diagram illustrating an apparatus for preventing erroneous detection of jack plug according to one exemplary embodiment of the present disclosure. FIG. 4 is a circuit diagram for preventing erroneous detection of a jack plug according to one exemplary embodiment of the present disclosure.

Referring to FIGS. 1, 3 and 4, an apparatus for detecting a jack plug in the electronic device 300 includes a baseband module 324 and electric circuits for detecting a jack plug of the earphone 6. Herein, the baseband module 324 includes a General Purpose Input Output pin (GPIO) 325 and an audio block 326.

First of all, a detection terminal 353 of the electronic device 300 provides a signal indicating whether the earphone 6 is connected to the jack 10 to the GPIO 325 of the baseband module 324. When the earphone 6 is not connected to the jack 10, the detection terminal 353 keeps a high state and provides a higher voltage than a reference voltage 3513 to a first comparator 3512. When the earphone 6 is connected to the jack 10, the detection terminal 353 keeps a low state and provides a lower voltage than the reference voltage 3513 to the first comparator 3512. Herein, the reference voltage 3513 of the first comparator 3512 can be set by a developer of the electronic device 300.

When the earphone 6 is not connected to the jack 10, the first comparator 3512 receives the voltage which is higher than the reference voltage 3513 from the detection terminal 353 and provides a voltage of a high signal to the baseband module 324. When the earphone 6 is connected to the jack 10, the first comparator 3512 receives the voltage which is lower than the reference voltage 3513 from the detection terminal 353 and provides a low signal to the baseband module 324.

The GPIO 325 of the baseband module 324 determines whether the earphone 6 is connected to the jack 10 using the signal input from the first comparator 3512. That is, when the high signal is input from the first comparator 3512, the GPIO 325 determines that the earphone 6 is not connected to the jack 10. When the low signal is input from the first comparator 3512, the GPIO 325 determines that the earphone is connected to the jack 10.

Also, the GPIO 325 determines whether the earphone 6 connected to the jack 10 of the electronic device 300 is a 3-pole or a 4-pole earphone using a signal input from a second comparator 3522. When the earphone 6 is a 4-pole earphone, the GPIO 325 detects whether a SEND/END key is pushed and performs a corresponding operation.

When a 3-pole earphone is inserted into the jack 10, the second comparator 3522 receives a higher voltage than a reference voltage 3523 from an EAR_KEY end 354 and outputs a high signal. When a 4-pole earphone is inserted into the jack 10, the second comparator 3522 receives a lower voltage than the reference voltage 3521 from the EAR_KEY end 354 and outputs a low signal. Herein, the reference voltage 3523 is set by the developer of the electronic device 300. Also, when the SEND/END key of the 4-pole earphone is pushed, the second comparator 3522 receives a higher voltage than the reference voltage 3524 from the EAR_KEY end 354 and outputs the high signal.

The GPIO 325 determines that a 3-pole earphone is inserted into the jack 10 when the high signal is input from the second comparator 3522 in a state where the low signal is input from the second comparator 3512. The GPIO 325 determines that a 4-pole earphone is connected to the jack 10 when the low signal is input from the second comparator. Herein, when the GPIO 325 of the baseband module 324 determines that a 4-pole earphone is being connected to the jack 10 through the first comparator 3512 and the second comparator 3522, if the signal from the second comparator 3522 is changed to a high level and is then changed to a low level, the GPIO 325 determines that the SEND/END key of a 4-pole earphone is pushed and performs a switching function for operating the audio block 326.

Also, the audio block 326 included in the baseband module 324 receives and processes a microphone signal of the earphone 6 connected to the jack 10 of the electronic device 300 through an EARMIC_P end 357.

When a 4-pole earphone is connected to the jack 10 and the SEND/END key is pushed, the EARMIC_P end 357 receives a voice signal of a user and provides the received voice signal of the user to the audio block 326.

In accordance with one embodiment of the present disclosure, at least one circuit element 370 is interposed between the detection terminal 353 and the first comparator 3512 to lower the input voltage than the reference voltage 3513. Therefore, although an input voltage value of the first comparator 3512 is changed by conductive particles inserted into the jack 10 of the electronic device 300, it is prevented for the electronic device 300 to recognize erroneously that the jack plug 30 is inserted into the jack 10 because the voltage value is lowered than the reference voltage 3513.

For example, if a reference voltage applied to a conventional comparator is 1.8V, the reference voltage 3513 for the first comparator 3512 is lowered to 1.35V, and a corresponding resistor 371 of FIG. 4 is interposed between the detection terminal 353 and the first comparator 3512 to have a value corresponding to the reference voltage 3513. Accordingly, the voltage supplied to the first comparator 3512 is not lowered than the reference voltage 3513 when conductive particles are inserted, and the first comparator 3512 will keep a high state. It is preferable that the resistor 371 and a diode 72 are disposed in a front end of an MIC_BIAS end 355.

As shown in FIG. 4, the resistor 371 and the diode 372 are interposed in series between the detect end (LEFT/DET) of the SPK_L pin and the first comparator 3512. A resistance value of the resistor connected to the first comparator 3512 can be adjusted and a corresponding reference voltage is programmable.

The diode 372 connected to the resistor 371 in series prevents voltage supplied to the first comparator 3512 by an audio input signal of the SPK_L end. Accordingly, the diode 373 allows the first comparator 315 to set the reference voltage 3513 to have the lowest value and helps the first comparator 315 to perform a stable operation.

Therefore, the electronic device according to one embodiment of the present disclosure keeps the high signal of the first comparator by interposing the resistor and the diode between the detection terminal and the first comparator and lowering the reference voltage which is lowered because the jack is conducted. The electronic device may prevent error recognition by inflow of conductive particles. As a result, reliability of the electronic device is improved.

Also, the electronic device according to one embodiment of the present disclosure may be applied various devices including the jack for allowing a user to listen to a speaker sound with the earphone. Particularly, the electronic device may be applied to a portable terminal for communication such as a smart phone.

While the present disclosure has been particularly shown and described with reference to exemplary embodiments thereof, it will be understood by those skilled in the art that various changes in form and details may be made therein without departing from the spirit and scope of the present invention as defined by the appended claims.

What is claimed is:

1. An apparatus for preventing erroneous detection of a jack, the apparatus comprising:
    a detection terminal configured to detect whether a jack plug is inserted into the jack;
    a comparator configured to compare a voltage input from the detection terminal with a predetermined reference voltage and output a comparison result signal to a baseband module of the apparatus;
    a power source interposed between the detection terminal and the comparator; and
    a resistor with a certain resistance value, being interposed between the detection terminal and the power source to prevent the voltage input at the detection terminal from being decreased to less than the predetermined reference voltage when conductive material/particles other than the jack plug is inserted into the jack.

2. The apparatus of claim 1, wherein the unintended conductive material is conductive particles inserted into the jack.

3. The apparatus of claim 1, wherein the detection terminal contacts the jack plug and receives an audio input signal from an SPK_L end disposed at a bottom of the jack plug upon connecting with the SPK_L end.

4. The apparatus of claim 1, wherein the detection terminal provides a voltage which is less than or equal to the reference voltage to the comparator when the jack plug is completely inserted into the jack, the comparator provides comparison result to the baseband module, and the apparatus recognizes connection to an earphone.

5. The apparatus of claim 3, wherein the jack includes a diode disposed with the resistor in series, which is interposed between the detection terminal and the comparator, preventing a voltage from the audio input signal from being communicated to the comparator, and wherein the reference voltage is lower than a reference voltage that is required if the voltage from the audio input signal was communicated to the comparator.

6. The apparatus of claim 1, wherein the jack receives the jack plug with either a 3-pole or a 4-pole terminal.

7. A method of preventing erroneous detection of a jack in an electronic device, the method comprising:
    comparing, via a comparator, a voltage input from a detection terminal with a predetermined reference voltage; and
    providing the compared result to a baseband module of the electronic device,
    wherein a resistor having a certain resistance value is interposed between the detection terminal and a power source to prevent the voltage input at the detection terminal from being decreased to less than the reference voltage when conductive material/particles other than the jack plug is inserted into the jack,
    wherein the power source is interposed between the detection terminal and the comparator.

8. The method of claim 7, wherein the unintended conductive material is conductive particles inserted into the jack.

9. The method of claim 7, wherein the detection terminal detects the jack plug and receives an audio input signal of an SPK_L end disposed at a bottom of the jack plug upon connecting with the SPK_L end.

10. The method of claim 7, wherein the detection terminal provides a voltage which is less than or equal to the reference voltage to the comparator when a jack plug is completely inserted into the jack, the comparator provides a low voltage signal to the baseband module of the electronic device.

11. The method of claim 9, wherein the jack includes a diode disposed with the resistor in series, which is interposed between the detection terminal and the comparator, for preventing a voltage from the audio input signal from being communicated to the comparator, and wherein the reference voltage is lower than a reference voltage that is required if the voltage from the audio input signal was communicated to the comparator.

12. The method of claim 9, further comprising adjusting the reference voltage of the comparator and the resistance value to keep the high signal and provide the high signal to the baseband module at the comparator when conductive material/particles other than a jack plug in inserted into the jack.

13. An electronic device equipped with a jack for receiving a jack plug, the electronic device comprising:
    a detection terminal configured to detect whether the jack plug is inserted into the jack;
    a comparator configured to compare a voltage input from the detection terminal with a predetermined reference voltage and provide a comparison result signal to a baseband module of the electronic device;
    a power source interposed between the detection terminal and the comparator; and
    a resistor with a certain resistance value being interposed between the detection terminal and the power source to prevent the voltage input at the detection terminal from being decreased to less than the predetermined-reference voltage when conductive material/particles other than the jack plug is inserted into the jack.

14. The electronic device of claim 13, wherein the electronic device recognizes the jack plug and receives an audio input signal of an SPK_L end disposed at a bottom of the jack plug by connecting with the SPK_L end.

15. The electronic device of claim 13, wherein the detection terminal provides a voltage which is less than or equal to the reference voltage to the comparator when the jack plug is completely inserted into the jack, the comparator provides a low signal to the baseband module, and the detection terminal detects connection of an earphone.

16. The electronic device of claim 14, wherein the jack includes a diode being disposed with the resistor in series, which is interposed between the detection terminal and the comparator for preventing a voltage from the audio input signal from being communicated to the comparator so that the reference voltage can be lower than a reference voltage that would otherwise be required if the voltage from the audio input signal was communicated to the comparator.

17. The electronic device of claim 13, wherein the jack recognizes the jack plug of an earphone, having either a 3-pole or a 4-pole terminal.

18. The electronic device of claim 13, wherein the electronic device is a portable communication terminal.

* * * * *